(12) United States Patent
Krithivasan et al.

(10) Patent No.: US 11,122,678 B2
(45) Date of Patent: Sep. 14, 2021

(54) PACKAGED DEVICE HAVING IMBEDDED ARRAY OF COMPONENTS

(71) Applicant: Tesla, Inc., Palo Alto, CA (US)

(72) Inventors: Vijaykumar Krithivasan, Mountain View, CA (US); Jin Zhao, San Jose, CA (US); Mengzhi Pang, Cupertino, CA (US); Steven Wayne Butler, San Jose, CA (US); Ganesh Venkataramanan, Sunnyvale, CA (US); Yang Sun, Palo Alto, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/735,573

(22) Filed: Jan. 6, 2020

(65) Prior Publication Data
US 2020/0221568 A1  Jul. 9, 2020

Related U.S. Application Data

(60) Provisional application No. 62/789,021, filed on Jan. 7, 2019, provisional application No. 62/793,046, filed on Jan. 16, 2019.

(51) Int. Cl.
| | | |
|---|---|---|
| *H05K 1/02* | (2006.01) | |
| *H01L 23/00* | (2006.01) | |
| *H05K 3/30* | (2006.01) | |

(52) U.S. Cl.
CPC .......... *H05K 1/023* (2013.01); *H01L 24/13* (2013.01); *H05K 1/0224* (2013.01); *H05K 3/301* (2013.01); *H01L 2224/13025* (2013.01)

(58) Field of Classification Search
CPC ...... H05K 1/023; H05K 1/0224; H05K 3/301; H01L 24/13; H01L 2224/13025
USPC ......................................................... 174/261
See application file for complete search history.

(56) References Cited

U.S. PATENT DOCUMENTS

| | | |
|---|---|---|
| 2013/0201615 A1 | 8/2013 | Arnold et al. |
| 2016/0276307 A1 | 9/2016 | Lin |
| 2017/0263518 A1* | 9/2017 | Yu ........................... H01L 25/00 |

OTHER PUBLICATIONS

International Search Report and Written Opinion dated Apr. 28, 2020 in PCT/US2020/012414.

* cited by examiner

*Primary Examiner* — Tremesha S Willis
(74) *Attorney, Agent, or Firm* — Knobbe, Martens, Olson & Bear, LLP

(57) ABSTRACT

A structure having imbedded array of components is described. An example structure includes an imbedded component array layer having an array of imbedded passive devices contained therein. The structure further includes an Integrated Fan-Out (InFO) layer residing adjacent a first surface of the imbedded component array layer having traces and vias formed therein. The structure further includes an insulator layer residing adjacent a second surface of the imbedded component array layer and electrically coupled to at least the InFO layer and vias passing through the imbedded component array layer and electrically coupled to some of vias of the InFO layer.

14 Claims, 13 Drawing Sheets

PACKAGED DEVICE HAVING IMBEDDED ARRAY OF COMPONENTS

INCORPORATION BY REFERENCE TO ANY PRIORITY APPLICATIONS

This application claims priority to U.S. Prov. App. No. 62/789,021 titled "PCT HAVING EMBEDDED ARRAY OF COMPONENTS" and filed on Jan. 7, 2019, and also claims priority to U.S. Prov. App. No. 62/793,046 titled "PACKAGED DEVICE HAVING IMBEDDED ARRAY OF COMPONENTS" and filed on Jan. 16, 2019, the disclosures of which are hereby incorporated herein by reference in their entireties.

BACKGROUND

Field of the Invention

The present invention relates generally to electronics, and more specifically to the structure of packaged integrated circuits.

Description of the Related Art

Electronics are currently installed in a large number of devices ranging from computers, automobiles, appliances, homes, and so on. Switching power supplies are commonly used to provide DC power within these electronics by performing voltage conversion, e.g., converting an input DC voltage to a lower DC or converting an input AC voltage to DC voltage. As an example, a Voltage Regulator Module (VRM) may be used to convert a voltage received from a battery or other DC source to a lower voltage for use by an Integrated Circuit (IC).

The requirement of high power for ICs, e.g., in excess of 500 watts, at relatively low voltages, e.g., less than one volt, creates problems for the VRM. The VRM must supply a relatively low DC voltage at many hundreds of amperes. Typically, VRMs are space constrained but must still include necessary components to produce clean power at a low voltage and with high current. The VRMs require substantial capacitance, inductance, and resistance to condition their output DC voltage, which typically requires a large number of lumped elements, e.g., capacitors, inductors, and resistors. It is difficult to include a large number of lumped elements in a small form factor device, e.g., a small foot print.

SUMMARY

One embodiment includes a structure. The structure comprises an imbedded component array layer having an array of imbedded passive devices contained therein; an Integrated Fanout (InFO) layer residing adjacent a first surface of the imbedded component array layer having a plurality of traces and a plurality of vias formed therein; an insulator layer residing adjacent a second surf ace of the imbedded component array layer and electrically coupled to at least the InFO layer; and a plurality of vias passing through the imbedded component array layer and electrically coupled to some of the plurality of vias of the InFO layer.

Another embodiment includes a structure. The structure comprises a first imbedded component array layer having a first array of imbedded passive devices contained therein; a second imbedded component array layer having a second array of imbedded passive devices contained therein; a first Integrated Fanout (InFO) layer residing adjacent a first surface of the first imbedded component array layer having a first plurality of traces and a second plurality of vias formed therein; a second InFO layer residing adjacent a first surface of the second imbedded component array layer having a second plurality of traces and a second plurality of vias formed therein; a connectivity layer residing adjacent a second surface of the first imbedded component array layer and adjacent a second surface of the second imbedded component array layer such that the connectivity layer is sandwiched between the first imbedded component array layer and the second imbedded component array layer, the connectivity layer a third plurality of traces and a third plurality of vias formed therein; a first plurality of vias passing through the first imbedded component array layer; and a second plurality of vias passing through the second imbedded component array layer.

Yet another embodiment includes a printed circuit board (PCB). The PCT comprises a core; an array of components formed in the core; a plurality of conductors coupled to the array of components; and a plurality of conductors that provide signal routing external to the PCB.

One embodiment includes a method for constructing a PCB capacitor. The method comprises forming a core having an array of components dispersed therein; forming a plurality of conductors coupled to the array of components; and forming a plurality of conductors that provide signal routing external to the PCB.

Another embodiment includes a PCB. The PCB comprises a first core; a first array of components formed in the first core; a second core; a second array of components formed in the second core; a plurality of conductors coupled to the first array of components; a plurality of conductors coupled to the second array of components; and a plurality of conductors that provide signal routing external to the PCB.

Yet another embodiment includes a method for constructing a Printed Circuit Board (PCB) capacitor. The method comprises forming a first core having a first array of components dispersed therein; forming a second core having a second array of components dispersed therein; forming a plurality of conductors coupled to the first array of components; forming a plurality of conductors coupled to the second array of components; and forming a plurality of conductors that provide signal routing external to the PCB.

DETAILED DESCRIPTION

Figure 1:
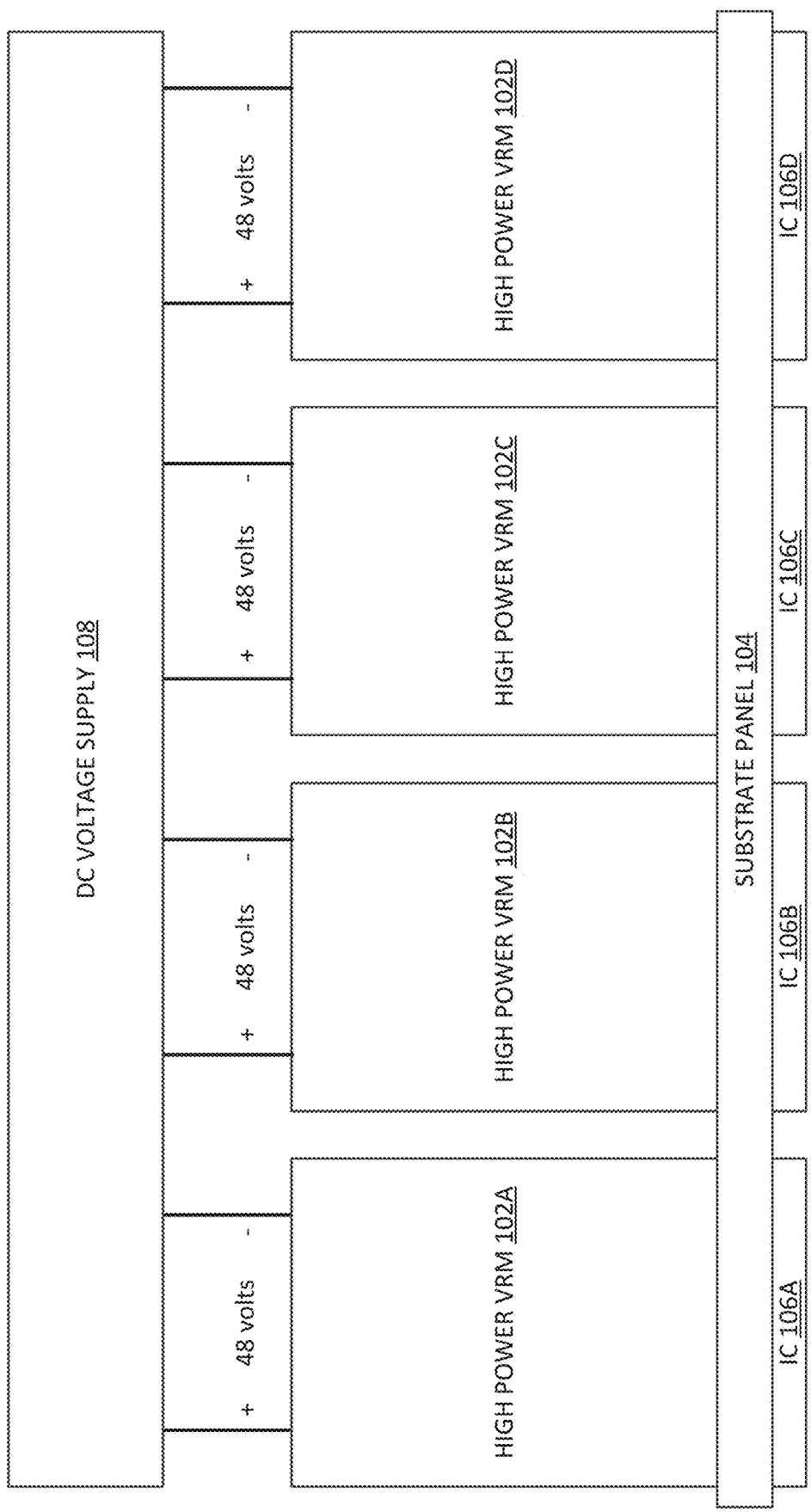
FIG. 1 is a block diagram illustrating a processing system that includes a plurality of multiple circuit board high power Voltage Regulator Modules (VRMs) constructed according to the present disclosure.

FIG. 1 is a block diagram illustrating a processing system that includes a plurality of multiple circuit board high power Voltage Regulator Modules (VRMs) constructed according to the present disclosure. The processing system 100 of FIG. 1 includes a plurality of multiple circuit board high power VRMs 102A, 102B, 102C, and 102D constructed according to the present disclosure that mounted on a substrate panel 104. The plurality of multiple circuit board high power VRMs 102A, 102B, 102C, and 102D are fed by a DC supply voltage 108, e.g., 48 volts, or another relatively high voltage, and respectively service a respective plurality of Integrated Circuits (ICs) 106A, 106B, 106C, and 106D. In some embodiments, each of the plurality of multiple circuit board high power VRMs 102A, 102B, 102C, and 102D produces an output of approximately 0.8 volts and provides 600 watts of power or more to the respective plurality of ICs 106A, 106B, 106C, and 106D. Thus, each of the plurality of multiple circuit board high power VRMs 102A, 102B, 102C, and 102D may, as an example, produce in excess of 100 amperes of current to the plurality of ICs 106A, 106B, 106C, and 106D. In some embodiments, the specific values described above may be adjusted and fall within the scope of the disclosure herein.

Because each of the plurality of multiple circuit board high power VRMs 102A, 102B, 102C, and 102D produces, with respect to the example above, an output of approximately 0.8 volts to the respective plurality of ICs 106A, 106B, 106C, and 106D and it is desirable for the footprint of the VRMs 102A-102D to be approximately the same as the footprints of the plurality of ICs 106A-106D, the footprint of the plurality of VRMs 102A-102D may be limited. In some embodiments, the footprint is approximately 3 centimeters by 3 centimeters, 4 centimeters by 4 centimeters, or other relatively small dimensions that approximate the cross section of the plurality of ICs 106A, 106B, 106C, and 106D. However, in order to produce power at low voltage and high power, the plurality of VRMs 102A-102D may include a relatively large number of discrete components.

Thus, according to the present disclosure, the plurality of multiple circuit board high power VRMs 102A, 102B, 102C, and 102D include circuit boards that are disposed in planes both parallel to the substrate panel 104 and in planes perpendicular to the substrate panel 104. One embodiment that will be described with reference to FIGS. 2, 3A, and 3B includes two circuit boards oriented perpendicular to the substrate panel 104 and two circuit boards oriented parallel to the substrate panel 104. With this structure, the VRMs 102A, 102B, 102C, and 102D extend above the substrate panel 104 in a direction perpendicular to the substrate panel.

Figure 2:
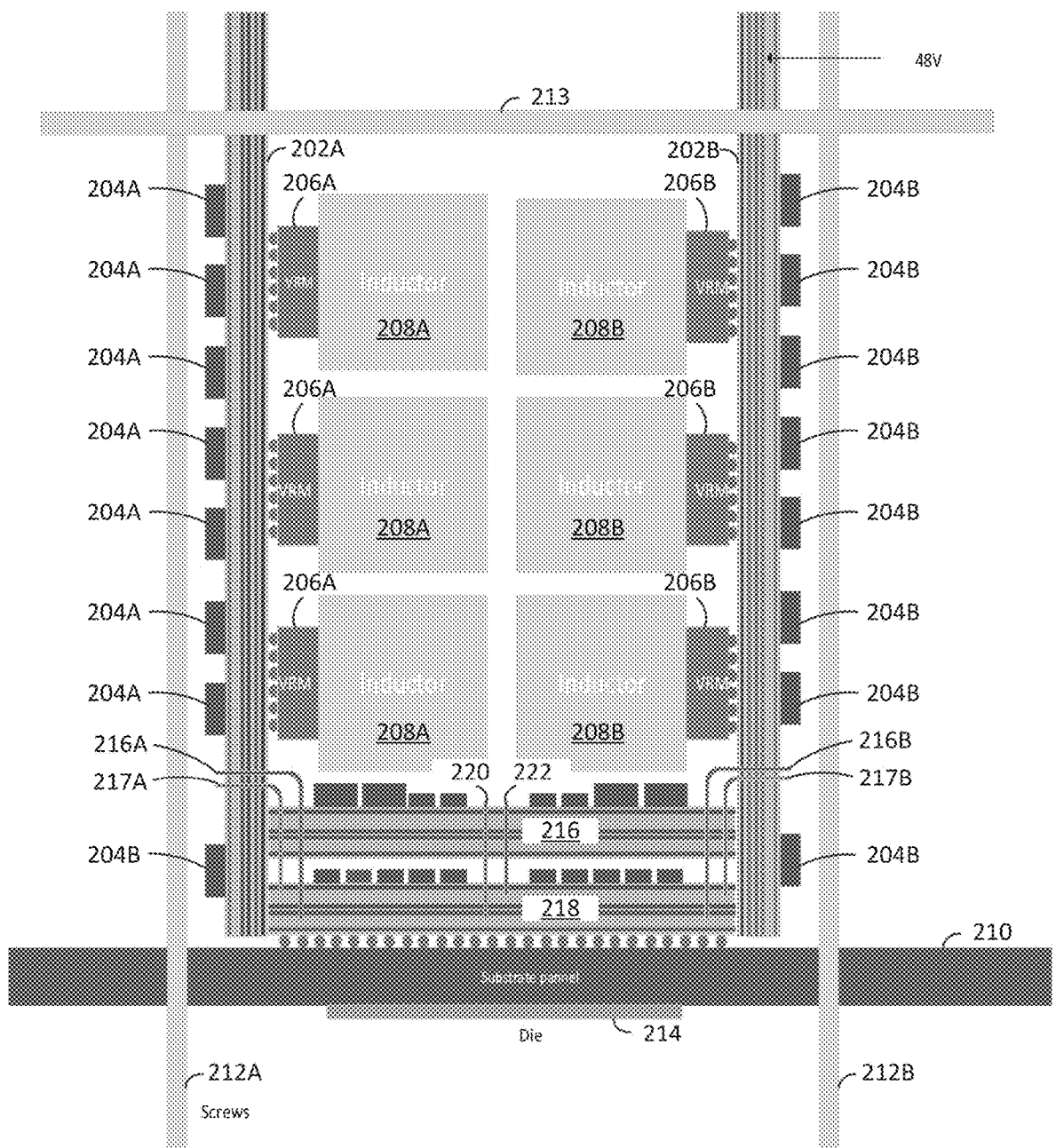
FIG. 2 is a block schematic diagram illustrating a multiple circuit board high power VRM according to the present disclosure.

FIG. 2 is a block schematic diagram illustrating a multiple circuit board high power VRM according to the present disclosure. The multiple circuit board high power VRM 200 includes a first voltage rail circuit board 202A, a second voltage rail circuit board 202B, a first capacitor circuit board 216, and a second capacitor circuit board 218. These components are mounted on rails 212A and 212B and on top brace 213, the rails 212A and 212B coupling to a substrate panel 210 using screws, for example. The second capacitor board 218 may couple to the substrate panel 210 via solder balls, which may have a pitch of 1 mm. The electrical connection formed by the substrate panel 210 couples a first rail voltage and a second rail voltage to die 214 mounted on an opposite side of the substrate panel 210.

The first voltage rail circuit board 202A is oriented in a first plane, has formed therein a first plurality of conductors (in a plurality of layers), and having mounted thereon a first plurality of VRM elements 206A, a first plurality of inductors 208A coupled to the first plurality of VRM elements 206A, and a first plurality of capacitors 204A. The first voltage rail circuit board 202A is configured to receive a first voltage and to produce the first rail voltage. The second voltage rail circuit board 202B is oriented in a second plane that is substantially parallel to the first plane, includes a second plurality of conductors formed therein (in a plurality of layers), and has mounted thereon a second plurality of VRM elements 206B, a second plurality of inductors 208B coupled to the second plurality of VRM elements 206B, and a second plurality of capacitors 204B. The second voltage rail circuit board 202B is configured to receive a second voltage and to produce the second rail voltage. The first and second voltages may be received from a battery pack within an electric vehicle.

The first capacitor circuit board 216 is oriented in a third plane that is substantially perpendicular to the first plane and has formed therein a third plurality of conductors. The first capacitor circuit board has mounted thereon a third plurality of capacitors. The second capacitor circuit board 218 is oriented in a fourth plane that is substantially parallel to the third plane and includes, has formed therein, a fourth plurality of conductors, and has mounted thereon a fourth plurality of capacitors.

The multiple circuit board high power VRM 200 further includes a fifth plurality of conductors 216A and 217 A coupling the first voltage rail circuit board 202A to the first capacitor circuit board 216 and to the second capacitor circuit board 218. The multiple circuit board high power VRM 200 further includes a sixth plurality of conductors 216B and 217B coupling the second voltage rail circuit board 202B to the first capacitor circuit board 216 and to the second capacitor circuit board 216. The high power VRM of claim 1, further comprising a seventh plurality of conductors 220 and 222 coupling the first capacitor circuit board 216 to the second capacitor circuit board 218.

Figure 3A:
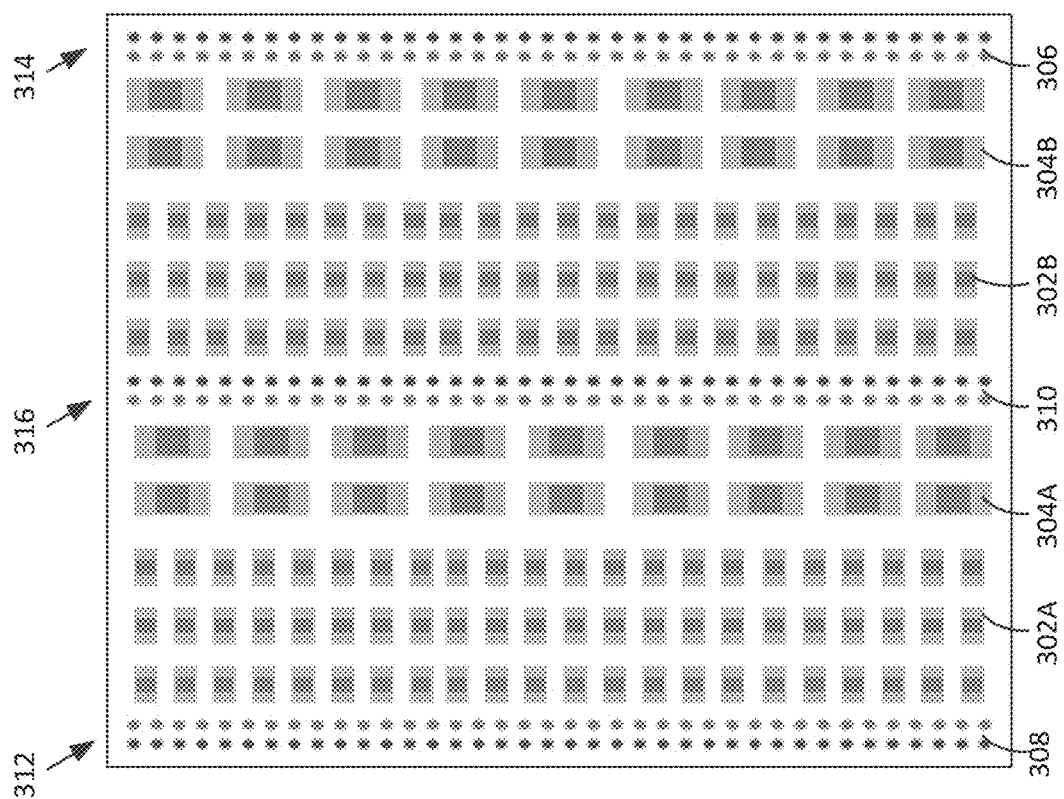
FIG. 3A is a block schematic diagram illustrating a first capacitor circuit board of the multiple circuit board high power VRM of FIG. 2.

FIG. 3A is a block schematic diagram illustrating a first capacitor circuit board of the multiple circuit board high power VRM of FIG. 2. The first capacitor circuit board 216 includes the third plurality of capacitors 302A, 304A, 302B, and 304B. Note that the capacitors 302A and 304A are located on a first side of the first capacitor circuit board 216 and that the capacitors 302B and 304B are located on a second side of the first capacitor circuit board 216. The fifth plurality of conductors 216A and 217A couple to connectors 308 of the first capacitor circuit board 216. Further, the sixth plurality of conductors 216B and 217B couple to connectors 306 of the first capacitor circuit board 216. The seventh plurality of conductors 220 and 222 couple to connectors 310 of the first capacitor circuit board 216.

Figure 3B:
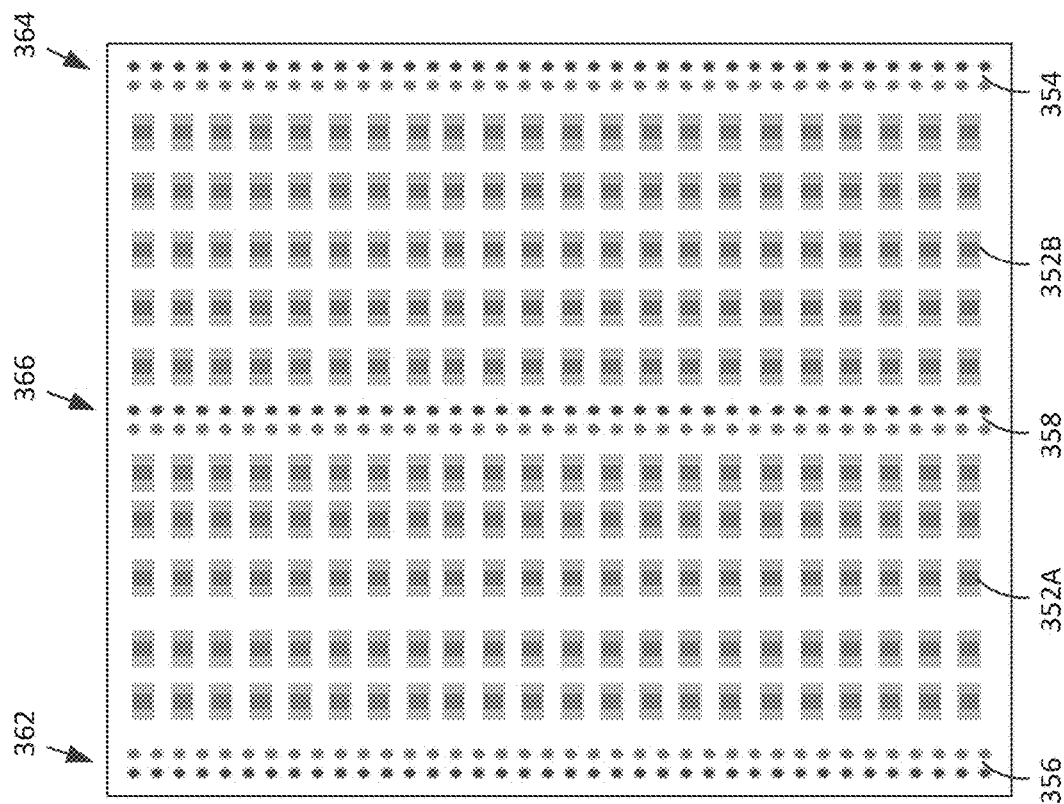
FIG. 3B is a block schematic diagram illustrating a second capacitor circuit board of the multiple circuit board high power VRM of FIG. 2.

FIG. 3B is a block schematic diagram illustrating a second capacitor circuit board of the multiple circuit board high power VRM of FIG. 2. The second capacitor circuit board 218 includes the fourth plurality of capacitors 352A, 354A, 352B, and 354B. Note that the capacitors 352A and 354A are located on a first side of the second capacitor circuit board 218 and that the capacitors 352B and 354B are located on a second side of the second capacitor circuit board 218. The fifth plurality of conductors 216A and 217 A couple to connectors 356 of the second capacitor circuit board 218. Further, the sixth plurality of conductors 216B and 217B couple to connectors 354 of the second capacitor circuit board 218. The seventh plurality of conductors 220 and 222 couple to connectors 358 of the second capacitor circuit board 218.

Referring to both FIGS. 3A and 3B, the fifth plurality of conductors 216A and 217 A couples to a first outer portion 312 of the first capacitor circuit board 216 and to a first outer portion 362 of the second capacitor circuit board 218. Further the sixth plurality of conductors 216B and 217B couples to a second outer portion 314 of the first capacitor circuit board 216 and to a second outer portion 364 of the second capacitor circuit board 218. Moreover, the seventh plurality of conductors 220 and 222 couples between a central portion 316 of the first capacitor circuit board 216 and a central portion 366 of the second capacitor circuit board 318.

Still referring to both FIGS. 3A and 3B, the third plurality of capacitors 302A, 304A, 302B, and 304B are configured to filter medium to low frequency components of the first rail voltage and the second rail voltage and the fourth plurality of capacitors 352A and 352B are configured to filter high frequency components of the first rail voltage and the second rail voltage.

With the embodiments of FIGS. 2, 3A and/or 3B, the input voltage received by the first voltage rail circuit board 202A and the second voltage rail circuit board 202B may be 48 volts with 0.8-volt signals used for communications therewith.

Figure 4:
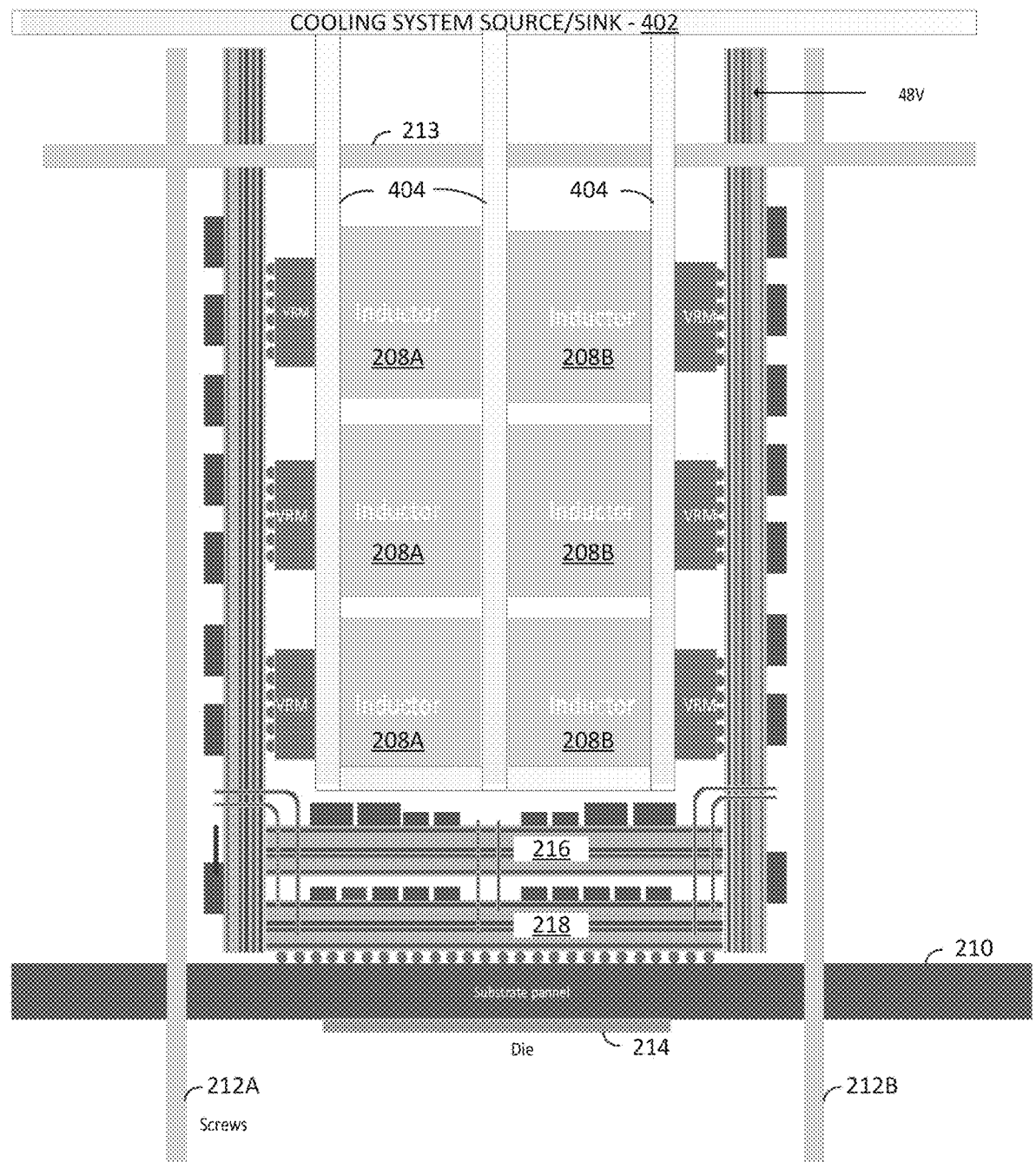
FIG. 4 is a block schematic diagram illustrating cooling system components of a multiple circuit board high power VRM according to the present disclosure.

FIG. 4 is a block schematic diagram illustrating cooling system components of a multiple circuit board high power VRM according to the present disclosure. The difference between the embodiment 200 of FIG. 2 and the embodiment 400 of FIG. 4 is the inclusion of the cooling system components. The first plurality of VRM elements 206A, the first plurality of inductors 208A, the second plurality of VRM elements 206B, the second plurality of inductors 208B produce significant heat in their operation. Thus, the multiple circuit board high power VRM includes a cooling system to cool these components. A cooling system source/sink 402 couples to piping 404 to service the flow of coolant to cool the VRM elements 206A/206B and the inductors 208A/208B. The piping 404 may include many segments. The piping 404 may couple directly to the VRM elements 206A/206B and the inductors 208A/208B or be thermally coupled thereto by intermediate structures. The cooling system source/sink 402 may service multiple circuit board high power VRMs as were illustrated in FIG. 1.

Figure 5:
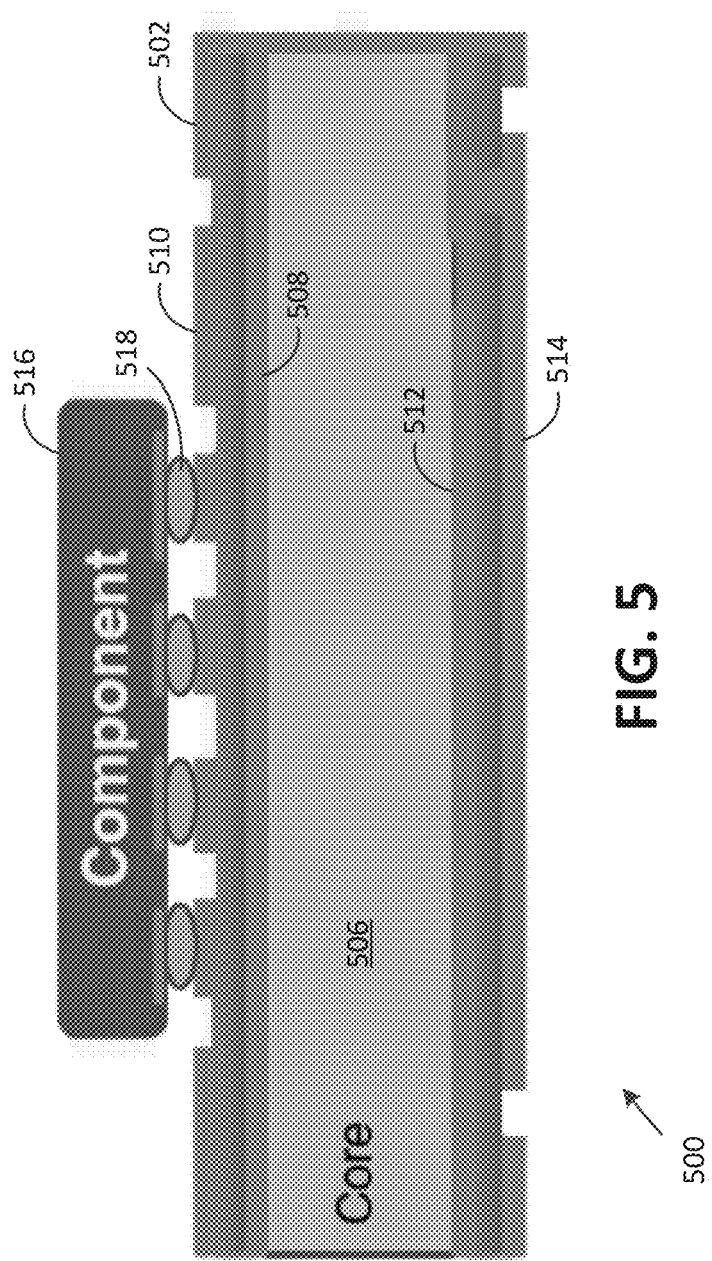
FIG. 5 is a partial sectional side view of a Printed Circuit Board (PCB) having an array of components mounted thereon.

FIG. 5 is a partial sectional side view of a Printed Circuit Board (PCB) having an array of components mounted thereon. The PCB 500 of FIG. 5 includes a core 506 and a plurality of conductors 502, 508, 510, 512, and 514 that provide signal routing, power routing, and shielding functions. A component 516 is mounted upon the PCB 500 via a ball grid array 518. The component 516 may be an IC, a lumped component structure, or another electronic element. The PCB 500 of FIG. 5 may be a conventional PCB formed according to known processes.

Figure 6:
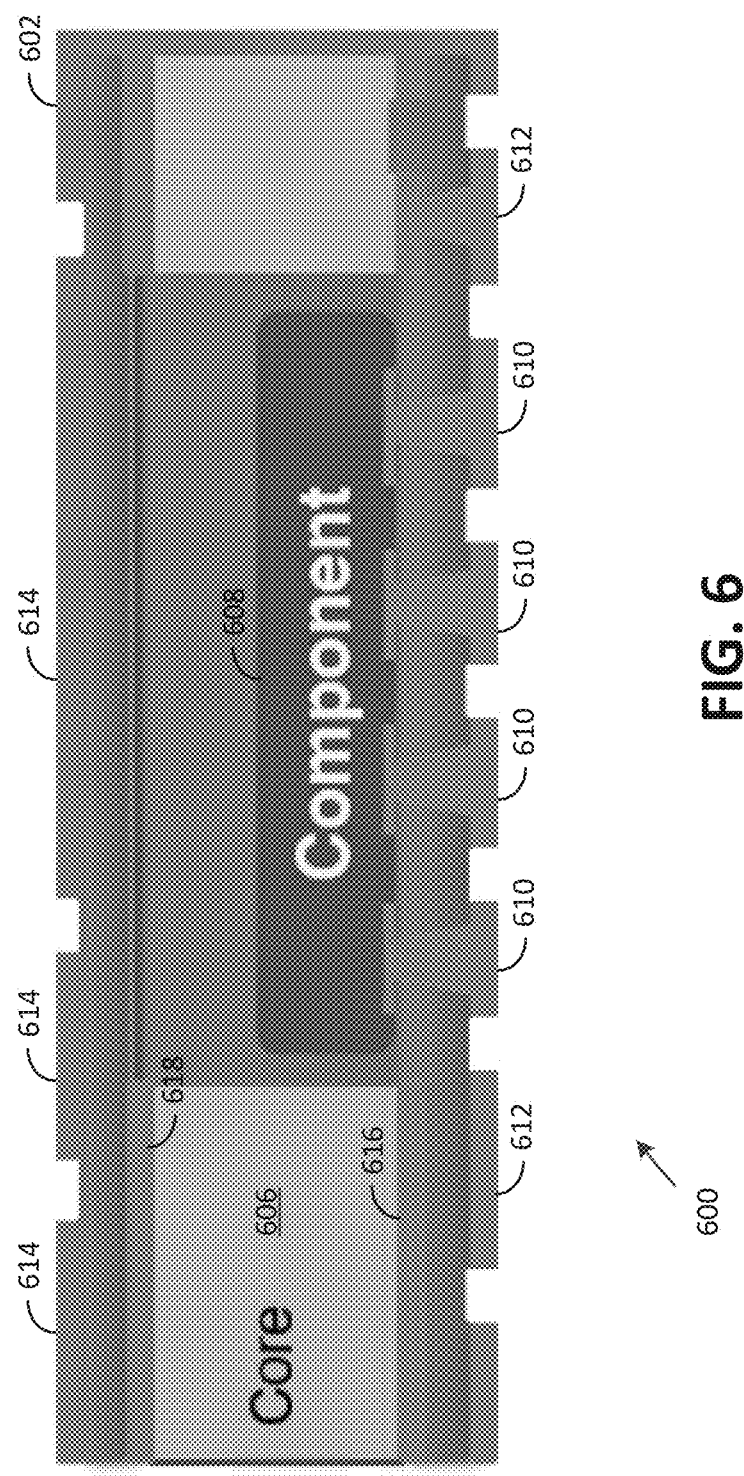
FIG. 6 is a partial sectional side view of a portion of a PCB having an imbedded array of components formed therein according to an embodiment of the present disclosure.

FIG. 6 is a partial sectional side view of a portion of a PCB having an imbedded array of components formed therein according to an embodiment of the present disclosure. The PCB 600 of FIG. 6 includes a core 606 and an array of components 608 contained therein. The components 608 may be capacitors, inductors, resistors or other component types. As will be shown in FIG. 7, the components 608 may be formed in an array within the core 606. The PCB 600 includes a plurality of conductors 602, 610, 612, 614, 616, and 618 that provide signal routing, power routing, and shielding for the PCB 500. Particularly, conductors 610 provide interconnection between the components 608 external to the PCB.

As compared to a PCB having surface mounted components, the PCB 600 of FIG. 6 provides important benefits. Because the components 608 are integrally formed within the PCB 600, they don't have to be mounted thereon, saving manufacturing steps, risk of interconnection failures, and reduced cost. Further, the PCB core 606 may provide heat dissipation advantages.

Figure 7:
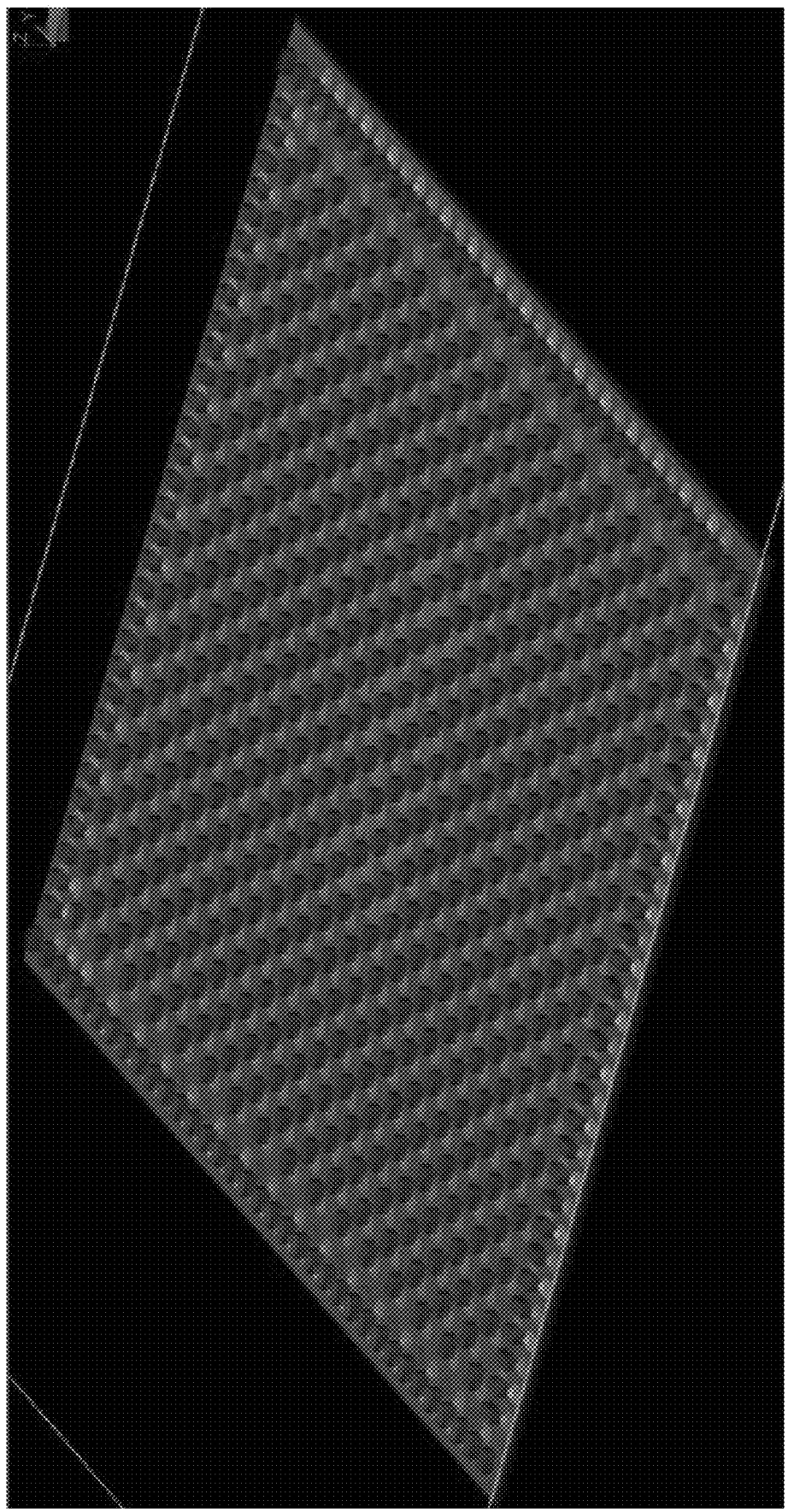
FIG. 7 is a transparent perspective view of an array of components imbedded within a core of a PCB according to an embodiment of the present disclosure.

FIG. 7 is a transparent perspective view of an array of components imbedded within a core of a PCB according to an embodiment of the present disclosure. As shown, the components are arranged in an array with somewhat equal spacing therebetween. This uniform arrangement reduces manufacturing costs and complexity. These components may be capacitors, inductors, resistors, other lumped elements or ICs that contain a number of components/circuits. In various embodiments, the array of components may have differing formation types. Further, in other embodiments, the array of components may have different portions, some of which are uniformly formed and some of which may be formed in a non-uniform fashion.

Figure 8:
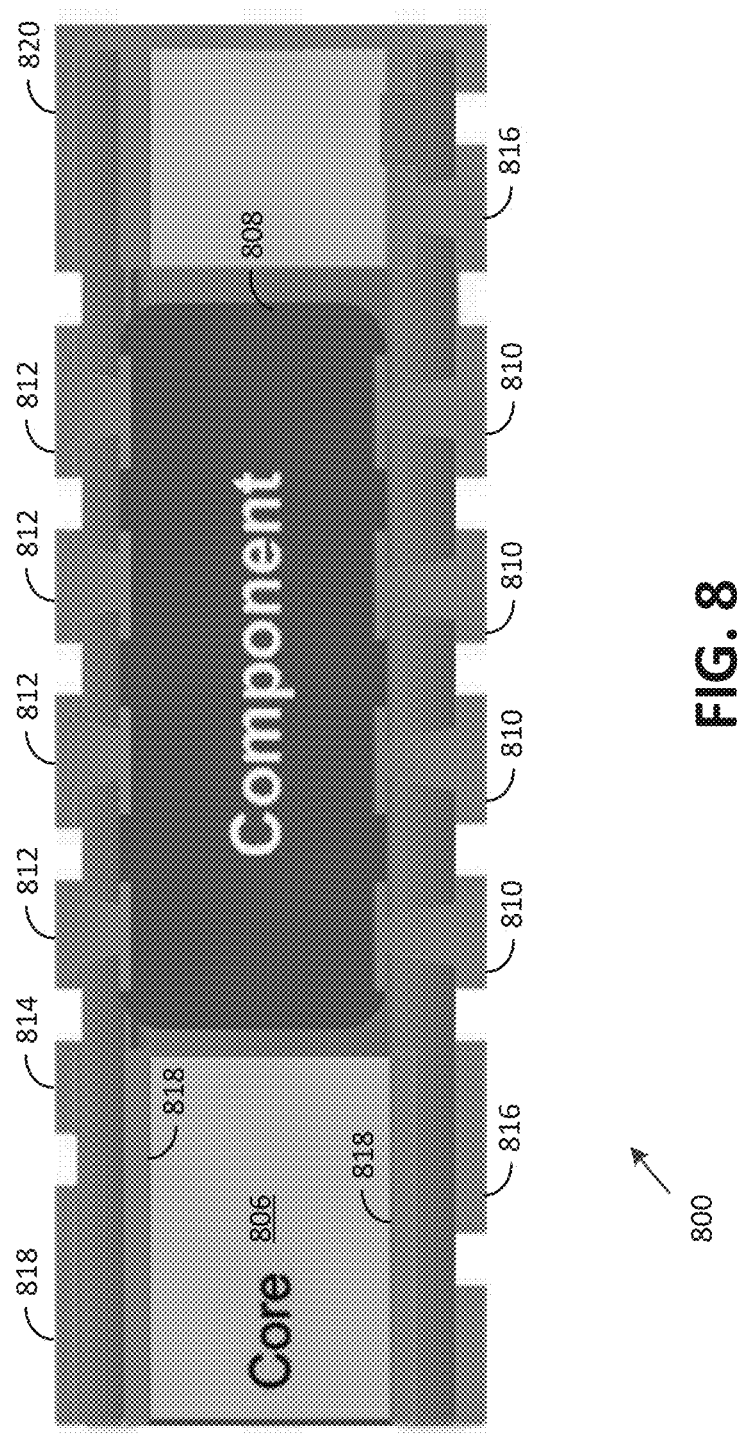
FIG. 8 is a partial sectional side view of a PCB having an imbedded array of components according to an embodiment of the present disclosure.

FIG. 8 is a partial sectional side view of a PCB having an imbedded array of components according to an embodiment of the present disclosure. The PCB 800 includes a core 806 with an array of components 808 formed therein. The PCB 800 also includes conductors 810, 812, 814, 816, 818 and 820 that perform signal routing, power routing, and shielding for the various components of the PCB 800. As contrasted to the structure of the PCB 700 of FIG. 7, the PCB 800 of FIG. 8 includes external connections 810 and 812 on both sides of the PCB 800 to the array of components 808.

Figure 9:
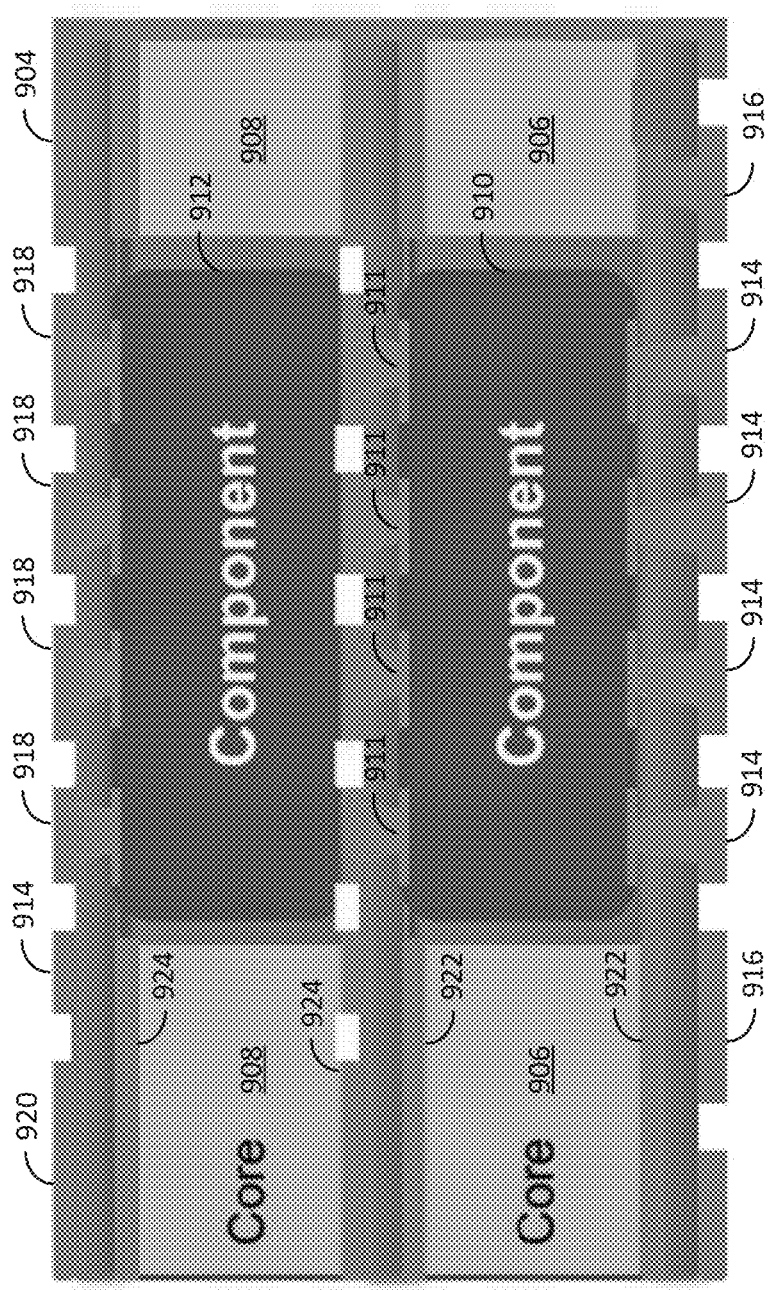
FIG. 9 is a partial sectional side view of two intercoupled PCBs, each having an imbedded array of components according to an embodiment of the present disclosure.

FIG. 9 is a partial sectional side view of two intercoupled PCBs, each having an imbedded array of components according to an embodiment of the present disclosure. The two intercoupled PCBs 900 include a first core 906, a first array of components 910 formed in the first core, a second core 908, and a second array of components 912 formed in the second core 908. The two intercoupled PCBs 900 may be separately formed and joined after formation. Alternately, the two intercoupled PCBs 900 may be formed in a single process. The two intercoupled PCBs 900 include conductors 904, 911, 914, 916, 918, 920, 922, and 924 that provide signal routing, power routing, and shielding functions. With the embodiment of FIG. 9, conductors 914 provide external connections to the first array of components 910, conductors 918 provide external connections to the second array of components 912, and conductors 911 provide interconnections between the first array of components 910 and the second array of components 912.

Figure 10:
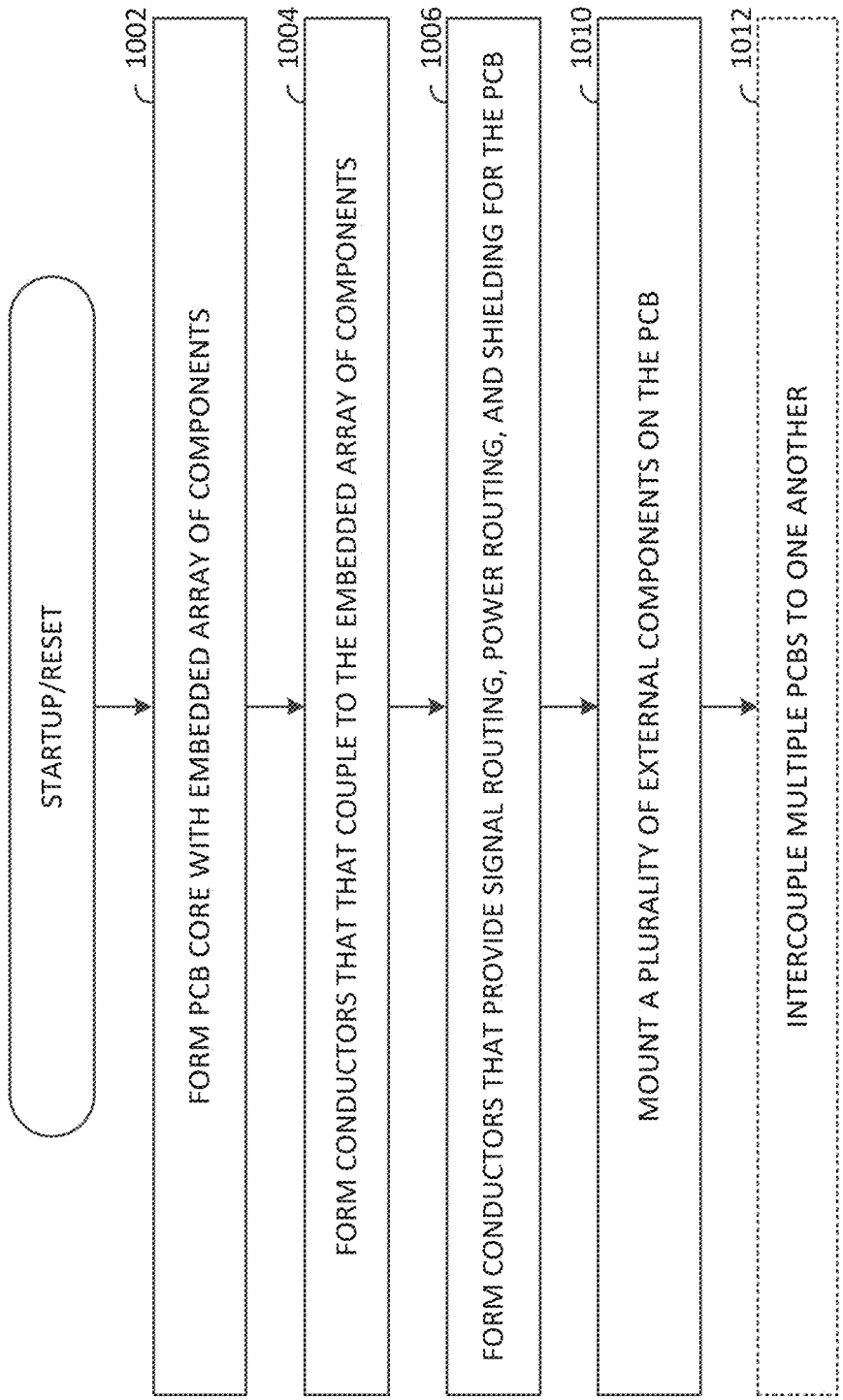
FIG. 10 is a flow diagram illustrating an embodiment for constructing a PCB according to the present disclosure.

FIG. 10 is a flow diagram illustrating an embodiment for constructing a PCB according to the present disclosure. The operations 1000 of FIG. 10 begin with forming the PCB core that includes the imbedded array of components (step 1002). Various techniques may be used to form the core. For example, the array of components may be organized into their desired arrangement and the core may be form around and about the array in one or more formation steps. Alternately, the core may be etched to form openings into which the array of components is mounted. Next, conductors are formed that intercouple the array of components (step 1004). Then, conductors are formed that provide signal routing, power routing and shielding for the PCB (step 1006). Then, a plurality of components, e.g., ICs, are mounted upon the PCB (step 1010). Finally, if a multiple PCB structure is being manufactured, multiple PCBs are intercoupled to one another (optional step 1012, e.g., to form the structure illustrated in FIG. 9). However, in other embodiments, the multiple PCB structure may be formed in a different manner in which the PCB has two cores that are formed in a single manufacturing process prior to the interconnection of external components.

While the description and diagrams herein consider that the array of components formed within the PCBs may include capacitors, inductors, resistors, ICs, or any various combination thereof. Further, these components could be packaged components, e.g., a package including multiple capacitors, multiple inductors, a combination of capacitors and inductors, a combination of capacitors, inductors, and resistors, etc. Moreover, while the PCBs disclosed herein are shown to be used by VRMs, the PCBs disclosed herein may be used in any various type of system other than VRMs. These systems may be used in an infrastructure, within a vehicle, or within any various type of installation.

Figure 11:
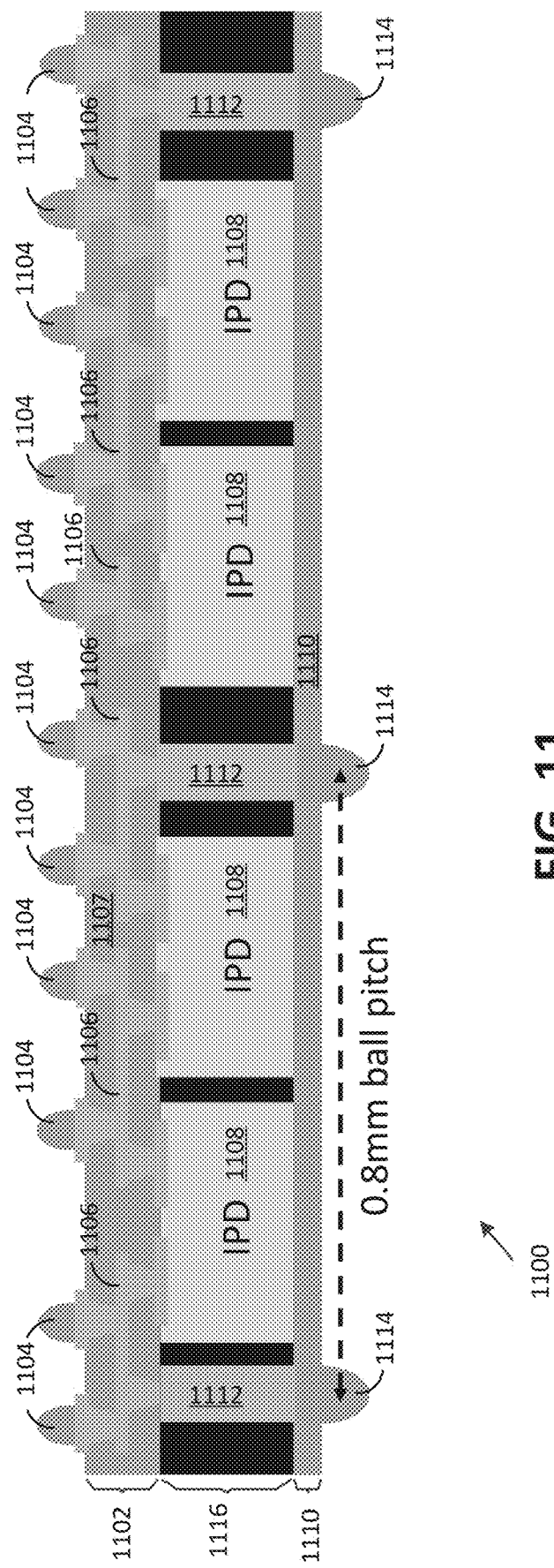
FIG. 11 is a partial sectional side view of a package having an imbedded array of components according to an embodiment of the present disclosure.

FIG. 11 is a partial sectional side view of a package (e.g., structure) having an imbedded array of components according to an embodiment of the present disclosure. The package 1100 includes an integrated fanout (InFO) layer 1102 that is formed in a packaging process that may be similar to a process used to form integrated circuits. The InFO layer 1102 includes an insulative portion 1107 and a plurality of conductors 1106 formed therein that provide signal connectivity between a plurality of imbedded passive devices (IPDs) 1108, e.g., capacitors, inductors, resistors, integrated circuits, etc. formed in an IPD array layer 1116 and a plurality of solder ball connections 1104. The plurality of conductors 1106 includes traces and vias coupled therebetween. Vias 1112, passing through the IPD array layer 1116 provide connectivity between the InFO layer 1102 conductors 1106 and solder balls 1114 formed in insulator layer 1110.

The InFO layer 1102 has similar expansion properties to the IPD array layer 1116 and the IPDs 1108 contained within the IPD array layer 1116, which increases yield and provides better integration due to similar thermal coefficients of expansion. Further, the package 1100, also referred to herein as an IPD module, is thinner, relative to a PCB containing the same IPD array, resulting in reduced space consumption.

Figure 12:
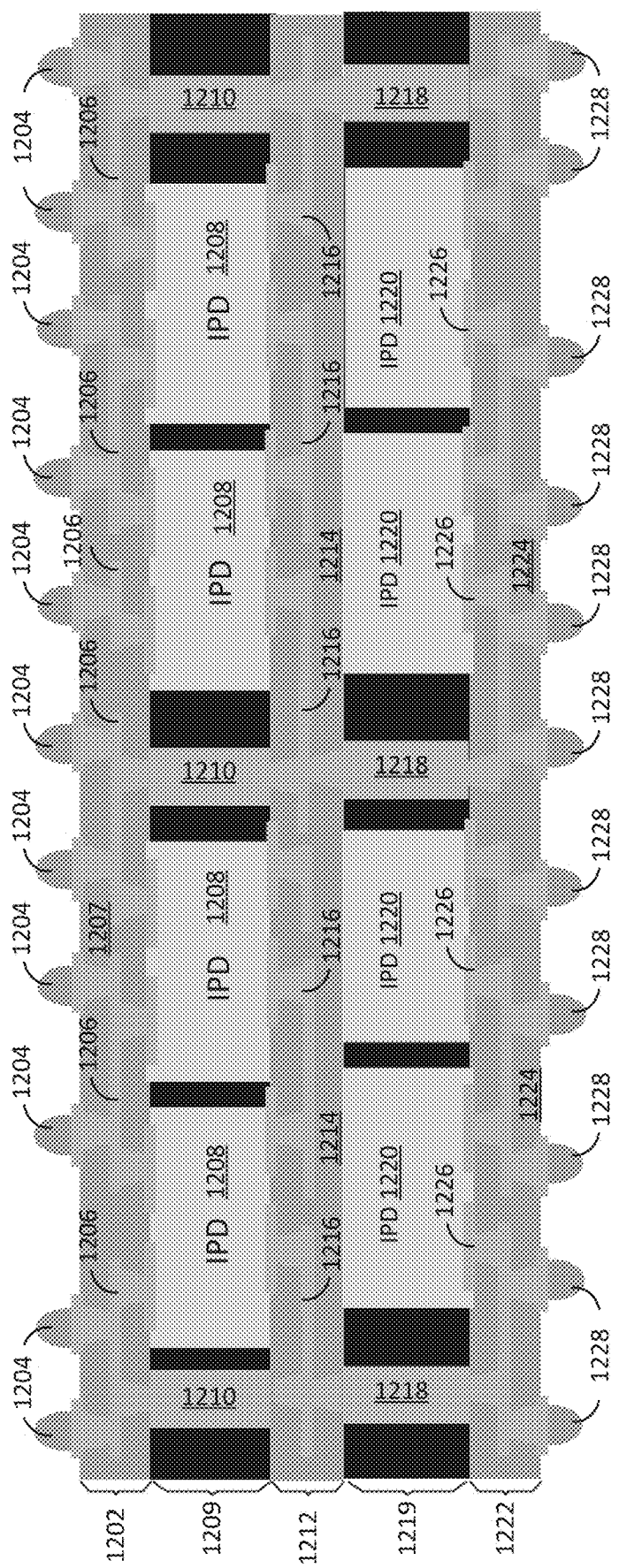
FIG. 12 is a partial sectional side view of a package having multiple layers of imbedded arrays of components according to an embodiment of the present disclosure.

FIG. 12 is a partial sectional side view of a package having multiple layers of imbedded arrays of components according to an embodiment of the present disclosure. The package 1200 includes a first InFO layer 1202, a second InFO layer 1222, and a connectivity layer 1212. The package 1200 further includes both a first IPD array layer 1209 sandwiched between the first InFO layer 1202 and the connectivity layer 1212 and a second IPD array layer 1219 sandwiched between the second InFO layer 1224 and the connectivity layer 1212. The connectivity layer 1212 may also be an InFO layer and includes an insulator portion and conductors 1216 having traces and vias. All of the first InFO layer 1202, the second InFO layer 1224, and the connectivity layer 1212 may be formed in a packaging process that may be similar to a process used to form integrated circuits.

The first InFO layer 1202 includes an insulative portion 1207 and a first plurality of conductors 1206 formed therein (having traces and vias) that provide signal connectivity between a plurality of IPDs 1208, e.g., capacitors, inductors, resistors, integrated circuits, etc. formed in the first IPD array layer 1209 and a plurality of solder ball connections 1204. The plurality of conductors 1206 includes traces and vias coupled therebetween. Vias 1210, passing through the first IPD array layer 1209 provide connectivity between the InFO layer 1202 conductors 1206 and the connectivity layer 1212 conductors 1216.

The second InFO layer 1222 includes an insulative portion 1224 and a plurality of conductors 1226 formed therein (having traces and vias) that provide signal connectivity between a plurality of IPDs 1220, e.g., capacitors, inductors, resistors, integrated circuits, etc. formed in the second IPD array layer 1219 and a plurality of solder ball connections 1228. The second plurality of conductors 1226 includes traces and vias coupled therebetween. Vias 1218, passing through the second IPD array layer 1209 provide connectivity between the second InFO layer 1222 conductors 1226 and the connectivity layer 1212 conductors 1216.

The first InFO layer 1202, the second InFO layer 1222, and the connectivity layer 1212 have similar expansion properties to the first IPD array layer 1209, the second IPD layer 1218, and the IPDs 1208 contained within the first IPD array layer 1209 and the IPDs 1220 contained within the second IPD layer 1219, which increases yield and provides better integration due to similar thermal coefficients of expansion. Further, the package 1200, also referred to herein as an IPD module, is thinner, relative to a PCB containing the same IPD array, resulting in reduced space consumption.

The IPD array layers of FIGS. 11 and 12 may have arrays of devices such as those illustrated in FIGS. 3A, 3B, and 7.

Figure 13:
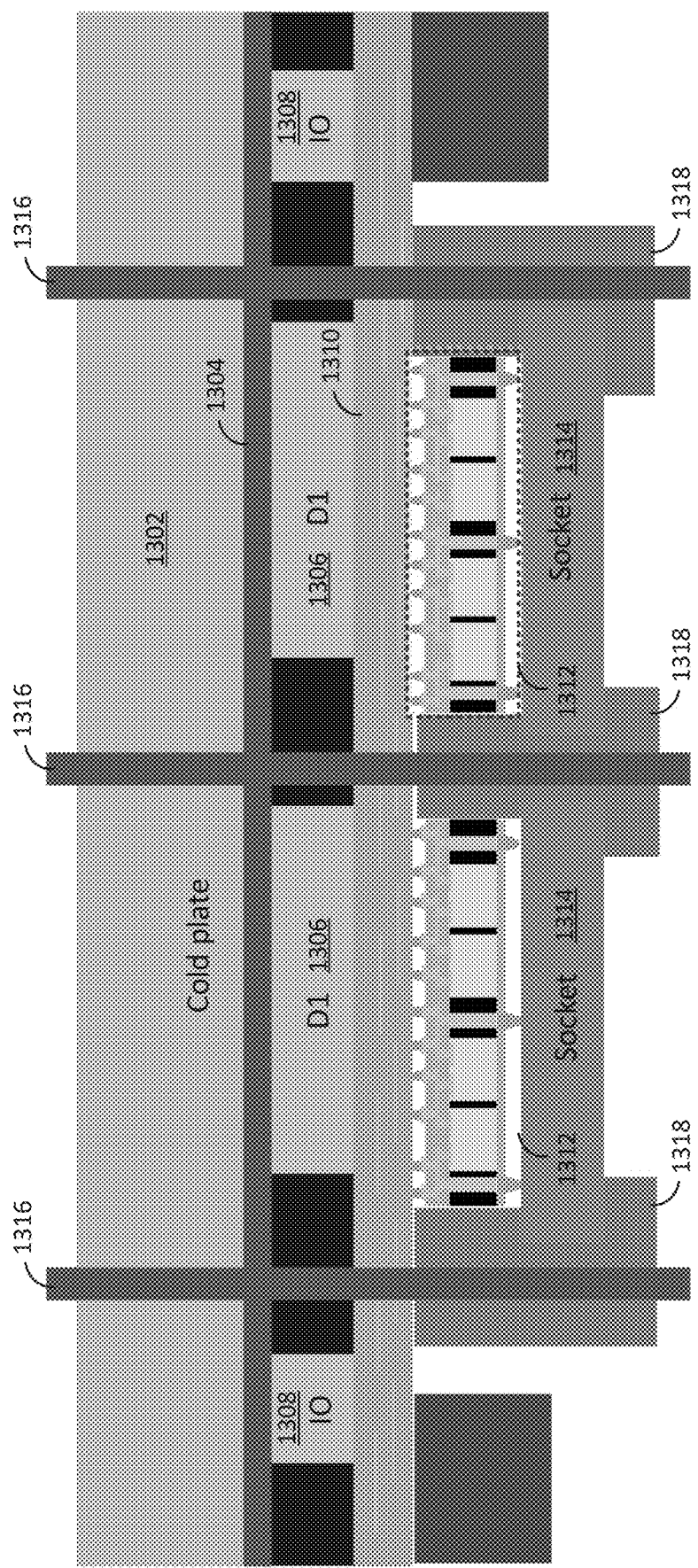
FIG. 13 is a partial sectional side view of an assembly having multiple packages, each with at least one imbedded array of components according to an embodiment of the present disclosure.

FIG. 13 is a partial sectional side view of an assembly having multiple packages, each with at least one imbedded array of components according to an embodiment of the present disclosure. As shown, IPD modules 1308 are contained in the assembly 1300. The assembly 1300 includes a cold plate 1302, a thermal conduction layer 1304, a plurality of devices 1306, a plurality of I/O components 1308, a signal routing layer 1310, IPD modules 1312, and sockets 1314. The assembly 1300 of FIG. 13 may be a VRM module or another type of assembly. Mounts 1318 and mounting members 1316 hold the assembly 1300 together and may be used to mount the assembly 1300 to another structure. The IPD modules 1312 may be either or both of the IPD module 1100 illustrated in FIG. 11 or the IPD module 1200 illustrated in FIG. 12.

The system and methods above have been described in general terms as an aid to understanding details of preferred embodiments of the present invention. Other preferred embodiments of the present include the described application for electric vehicles. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A structure comprising:
    an imbedded component array layer having a plurality of imbedded passive devices contained therein;
    an Integrated Fanout (InFO) layer residing adjacent a first surface of the imbedded component array layer having a plurality of traces and a plurality of vias formed therein, the InFO layer comprising a plurality of conductors electrically connecting the plurality of imbedded passive devices;
    an insulator layer residing adjacent a second surface of the imbedded component array layer and electrically coupled to at least the InFO layer, wherein the insulator layer has a plurality of solder balls formed therein; and
    a plurality of vias passing through the imbedded component array layer and electrically coupled to:
    some of the plurality of vias of the InFO layer, and
    the plurality of solder balls, thereby electrically coupling the insulator layer to the imbedded component array layer.

2. The structure of claim 1, further comprising:
    different solder balls providing electrical connections to the InFO layer, wherein the plurality solder balls provide electrical connections to the plurality of vias passing through the imbedded component array layer.

3. The structure of claim 1, wherein the array of components includes at least one of:
    lumped capacitors;
    lumped inductors;
    lumped resistors; or
    Integrated Circuits (ICs).

4. A structure comprising:
    a first imbedded component array layer having a first array of imbedded passive devices contained therein;
    a second imbedded component array layer having a second array of imbedded passive devices contained therein;
    a first Integrated Fanout (InFO) layer residing adjacent a first surface of the first imbedded component array layer having a first plurality of traces and a second plurality of vias formed therein, the first InFO layer comprising a plurality of conductors electrically connecting the first array of imbedded passive devices;
    a second InFO layer residing adjacent a first surface of the second imbedded component array layer having a second plurality of traces and a second plurality of vias formed therein, the second InFO layer comprising a plurality of conductors electrically connecting the second array of imbedded passive devices;
    a connectivity layer residing adjacent a second surface of the first imbedded component array layer and adjacent a second surface of the second imbedded component array layer such that the connectivity layer is sandwiched between the first imbedded component array layer and the second imbedded component array layer, the connectivity layer having a third plurality of traces and a third plurality of vias formed therein;

a first plurality of vias passing through the first imbedded component array layer; and a second plurality of vias passing through the second imbedded component array layer.

5. The structure of claim 4, further comprising:

first solder balls providing electrical connections to the first InFO layer; and second solder balls providing electrical connections to second InFO layer.

6. The structure of claim 4, wherein the array of components includes at least one of:

lumped capacitors;
lumped inductors;
lumped resistors; or
Integrated Circuits (ICs).

7. A Printed Circuit Board (PCB) comprising:

a first core;
a first array of components formed in the first core, wherein the first array of components is mounted in etched portions of the first core;
a second core;
a second array of components formed in the second core;
a plurality of conductors intercoupled to the first array of components;
a plurality of conductors coupled to the second array of components; and
a plurality of conductors that provide signal routing external to the PCB.

8. The PCB of claim 7, further comprising a plurality of conductors that provide electrical shielding.

9. The PCB of claim 7, wherein the plurality of conductors coupled to the first array of components provide connections to a plurality of components external to the PCB.

10. The PCB of claim 7, wherein the first array of components includes at least one of:

lumped capacitors;
lumped inductors;
lumped resistors; or
Integrated Circuits (ICs).

11. A method for constructing a Printed Circuit Board (PCB) comprising:

forming a first core via etching portions of the first core, wherein a first array of components is mounted in the etched portions of the first core;

forming a second core having a second array of components dispersed therein;

forming a plurality of conductors intercoupled to the first array of components;

forming a plurality of conductors coupled to the second array of components; and forming a plurality of conductors that provide signal routing external to the PCB.

12. The method of claim 11, further comprising forming a plurality of conductors that provide electrical shielding.

13. The method of claim 11, wherein the plurality of conductors coupled to the first array of components provide connections to a plurality of components external to the PCB.

14. The method of claim 11, wherein the first array of components includes at least one of:

lumped capacitors;
lumped inductors;
lumped resistors; or
Integrated Circuits (ICs).

* * * * *